(12) United States Patent
Kaynak et al.

(10) Patent No.: US 12,032,444 B2
(45) Date of Patent: *Jul. 9, 2024

(54) ERROR CORRECTION WITH SYNDROME COMPUTATION IN A MEMORY DEVICE

(71) Applicant: Micron Technology, Inc., Boise, ID (US)

(72) Inventors: Mustafa N. Kaynak, San Diego, CA (US); Patrick R. Khayat, San Diego, CA (US); Sivagnanam Parthasarathy, Carlsbad, CA (US)

(73) Assignee: MICRON TECHNOLOGY, INC., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 18/329,886

(22) Filed: Jun. 6, 2023

(65) Prior Publication Data

US 2023/0315570 A1    Oct. 5, 2023

Related U.S. Application Data

(63) Continuation of application No. 17/246,509, filed on Apr. 30, 2021, now Pat. No. 11,709,734.

(51) Int. Cl.
*G06F 11/10* (2006.01)
*G06F 11/00* (2006.01)
*H03M 13/00* (2006.01)

(52) U.S. Cl.
CPC ........ *G06F 11/1076* (2013.01); *H03M 13/00* (2013.01)

(58) Field of Classification Search
CPC ............ G06F 11/1076; G06F 11/1068; H03M 13/2906; H03M 13/1575; G11C 29/52
See application file for complete search history.

(56) References Cited

U.S. PATENT DOCUMENTS 11,061,771 B2    7/2021  Schaefer et al.
11,070,313 B2    7/2021  Yin et al.
(Continued)

FOREIGN PATENT DOCUMENTS

CN        112527549 A        3/2021

OTHER PUBLICATIONS

Non-Final Office Action, U.S. Appl. No. 17/246,509, Feb. 2, 2023, 6 pages.
(Continued)

*Primary Examiner* — Justin R Knapp
(74) *Attorney, Agent, or Firm* — NICHOLSON DE VOS WEBSTER & ELLIOTT LLP

(57) ABSTRACT

Methods, systems, and apparatus for error correction with syndrome computation in a memory device are described. A first syndrome for first encoded data is generated in a memory device. The first syndrome and the first encoded data are transmitted to a controller that is coupled with the memory device. A second syndrome for first and second encoded data is generated. The first encoded data and the second encoded data are interrelated according to an error correction code. The second syndrome is transmitted to the controller without the second encoded data and the controller is to decode the first encoded data based on at least one of the first syndrome, the second syndrome, or a combination thereof.

20 Claims, 7 Drawing Sheets

(56) References Cited

U.S. PATENT DOCUMENTS

| | | |
|---|---|---|
| 11,184,024 B2 * | 11/2021 | Xiong ................. G06F 11/1012 |
| 11,239,944 B1 * | 2/2022 | Pan ..................... H03M 13/251 |
| 2008/0052564 A1 | 2/2008 | Ym et al. |
| 2015/0089316 A1 | 3/2015 | Zhang et al. |
| 2017/0116078 A1 | 4/2017 | Sharon et al. |
| 2018/0083653 A1 | 3/2018 | Khayat et al. |
| 2019/0058493 A1 * | 2/2019 | Khayat ............. H03M 13/2918 |
| 2020/0192754 A1 | 6/2020 | Cho et al. |
| 2020/0250031 A1 | 8/2020 | Li et al. |
| 2022/0319618 A1 | 10/2022 | Muzzetto et al. |

OTHER PUBLICATIONS

Notice of Allowance, U.S. Appl. No. 17/246,509, Mar. 15, 2023, 5 pages.

First Office Action and Search Report for counterpart CN Application No. 202210454032.3, dated Mar. 31, 2024, 6 pages.

* cited by examiner

ERROR CORRECTION WITH SYNDROME COMPUTATION IN A MEMORY DEVICE

CROSS-REFERENCE TO RELATED APPLICATION

The present application claims the benefit of U.S. patent application Ser. No. 17/246,509 filed on Apr. 30, 2021, which is hereby incorporated by reference.

TECHNICAL FIELD

The present disclosure generally relates to error correction in memory subsystems, and more specifically, relates to error correction with syndrome computation in memory device.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
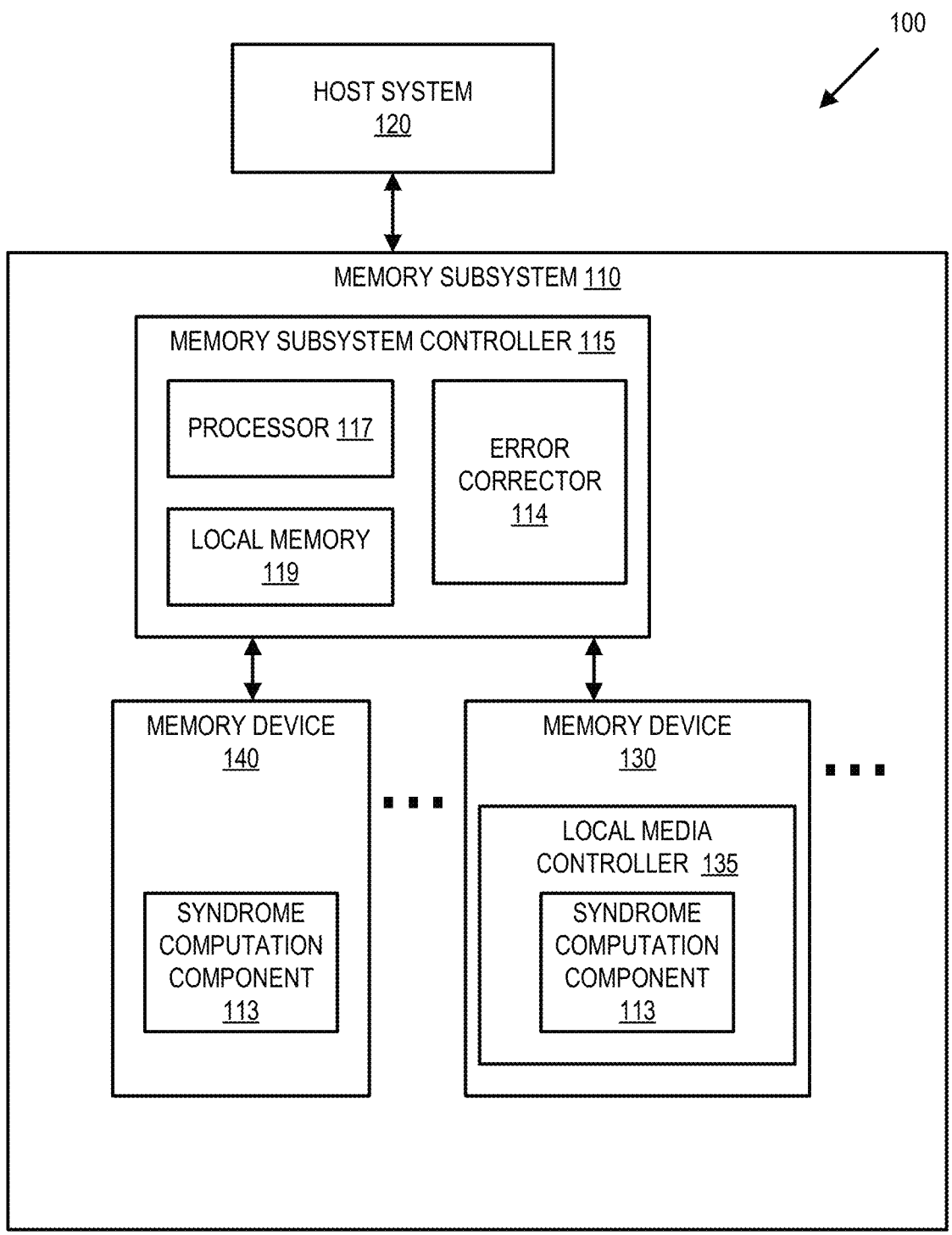
FIG. 1 illustrates an example computing system that includes a memory subsystem in accordance with some embodiments of the present disclosure.

Aspects of the present disclosure are directed to error correction with syndrome computation in a memory device. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, a SLC can store one bit of information and has two logic states.

A low-density parity check (LDPC) code is a widely adopted and effective error correcting code. LDPC codes use hard information and soft information to correct errors. Soft information indicates whether the current value of a given bit can be treated as having a high reliability or low reliability. Codes that rely on soft information, however, can suffer from high reliability errors (HRE's). For example, when data is initially written in error, an LDPC decoder can treat the erroneous bits as having high reliability because the soft information indicates a clean read. HRE's reduce the error correction capabilities of decoders. Thus, ECC decoders using soft information (reliability information) are vulnerable to HREs which happen in memory systems due to write-in errors or other mechanisms.

Product codes can deliver high error correction capability even in the presence of high reliability errors. Staircase codes are a type of product code that can be implemented in a forward error correction system. A staircase code includes a number of components, e.g., blocks, arranged in a predetermined pattern. Each component can include data bits and parity bits. In some staircase codes, each individual line and each individual column is a single codeword comprising the data bits and parity bits. In other staircase codes a horizontal codeword can span multiple columns and a vertical component can span multiple rows. In a staircase code, data spans adjacent components to form valid codewords according to an error correcting code (ECC). The parity bits of the columns and the rows are based on the underlying ECC, such as a Bose-Chaudhuri-Hocquenghem (BCH) code. Because the components of the code are arranged in a predetermined pattern, codewords can be formed in both the horizontal and vertical direction. That is, for any given data bit in a component, the bit is part of a horizontal codeword and a vertical codeword.

Data encoded according to a staircase code is doubly encoded and can be corrected independently using parity bits of the encoded data and/or using parity bits that are shared with other encoded data. A decoder of the staircase code relies on hard information and hence it is not vulnerable to high reliability errors. Correction capability of a decoder of the staircase code using one bit of encoded data is sufficient for low error rates. Moderate to high error rates can be corrected using more than one bit to decode one bit of encoded data. A staircase code achieves high raw bit error rate (RBER) correction by using more bits of information for each encoded bit. The decoding of these staircase codes based on multiple bits for each bit of encoded data, however, renders the use of these codes impractical in some memory subsystems. In an exemplary staircase code, for each bit of encoded data 3 bits are used for decoding the bit. When this staircase code is used to encode data in a memory subsystem, for every host request of n KB of data (e.g., 4 KB), (3×n) KB of data (e.g., 12 KB) is retrieved from the memory device to decode the encoded data. For example, the additional data can be retrieved to decode encoded data for ECCs that have moderate to high error rates. This causes severe performance degradation in the memory subsystem.

Aspects of the present disclosure address the above and other deficiencies by improving the decoding of encoded data in product codes. The embodiments presented herein perform syndrome generation for encoded data in a memory device and transmit the syndrome to an error corrector for decoding the encoded data. The embodiments presented herein enable the use of multiple ECCs that are decoded using syndrome-based decoders and are robust to HREs. In the embodiments described herein, in response to a request for data, a memory device transfers encoded data and one or more syndromes for the encoded data without transferring additional encoded data used by a product code to generate the one or more syndromes. The embodiments described herein significantly improve the performance of the memory subsystem by reducing the amount of data transmitted from a memory device in response to a request while achieving good correction capability and robustness to HREs.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM)

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes a syndrome computation component 113 and an error corrector 114 that implement a method of error correction with syndrome computation in a memory device. In some embodiments, the controller 115 includes at least a portion of the error corrector 114. For example, the controller 115 can include a processor 117 (processing device) configured to execute instructions stored in local memory 119 for performing the operations described herein. In some embodiments, an error corrector 114 is part of the host system 120, an application, or an operating system. The memory devices 130 and/or the memory device 140 include a syndrome computation component 113. In one embodiment, the local media controller 135 includes the syndrome computation component 113. The memory device can include a processor (processing device) configured to execute instructions for performing the operations of the syndrome computation component 113 described herein.

In some implementations, the error corrector 114 is operative to encode and decode data stored in the memory device (e.g., an encoder and/or decoder). Encoding data using an error correcting code (ECC) allows for correction of erroneous data bits when the data is retrieved from the memory device. For example, the error corrector 114 can encode data received from the host system 120 and store the data and parity bits as codewords in the memory device 130. The error corrector 114 can be further operative to decode data stored in the memory device 130 to identify and correct erroneous bits of the data before transmitting corrected data to the host system 120. Although illustrated as a single component that can perform encoding and decoding of data, the error corrector 114 can be provided as separate components. In some embodiments, the error corrector 114 is operative to encode data according to a product code, such as a staircase code. The error corrector 114 is operative to receive syndromes generated in the memory device, 130 or 140, by a syndrome computation component 113. The error corrector 114 is operative to decode the codewords stored in the memory device 130 based on syndromes. The error corrector 114 transmits the corrected data to the host system 120.

As described in further detail below, the syndrome computation component 113 is operative to generate one or more syndromes for encoded data. The syndrome computation component 113 transmits the syndrome(s) and the encoded data to the error corrector 114, e.g., in response to a request for data from the host system 120. The syndrome computation component 113 transmits the additional syndrome(s) without associated additional encoded data, e.g., data that is not subject to the request from the host system 120 but used to generate parity bits for the data that was requested by the host system 120. The error corrector 114 is operative to decode the encoded data based on one or more syndromes received from syndrome computation component 113.

Figure 2:
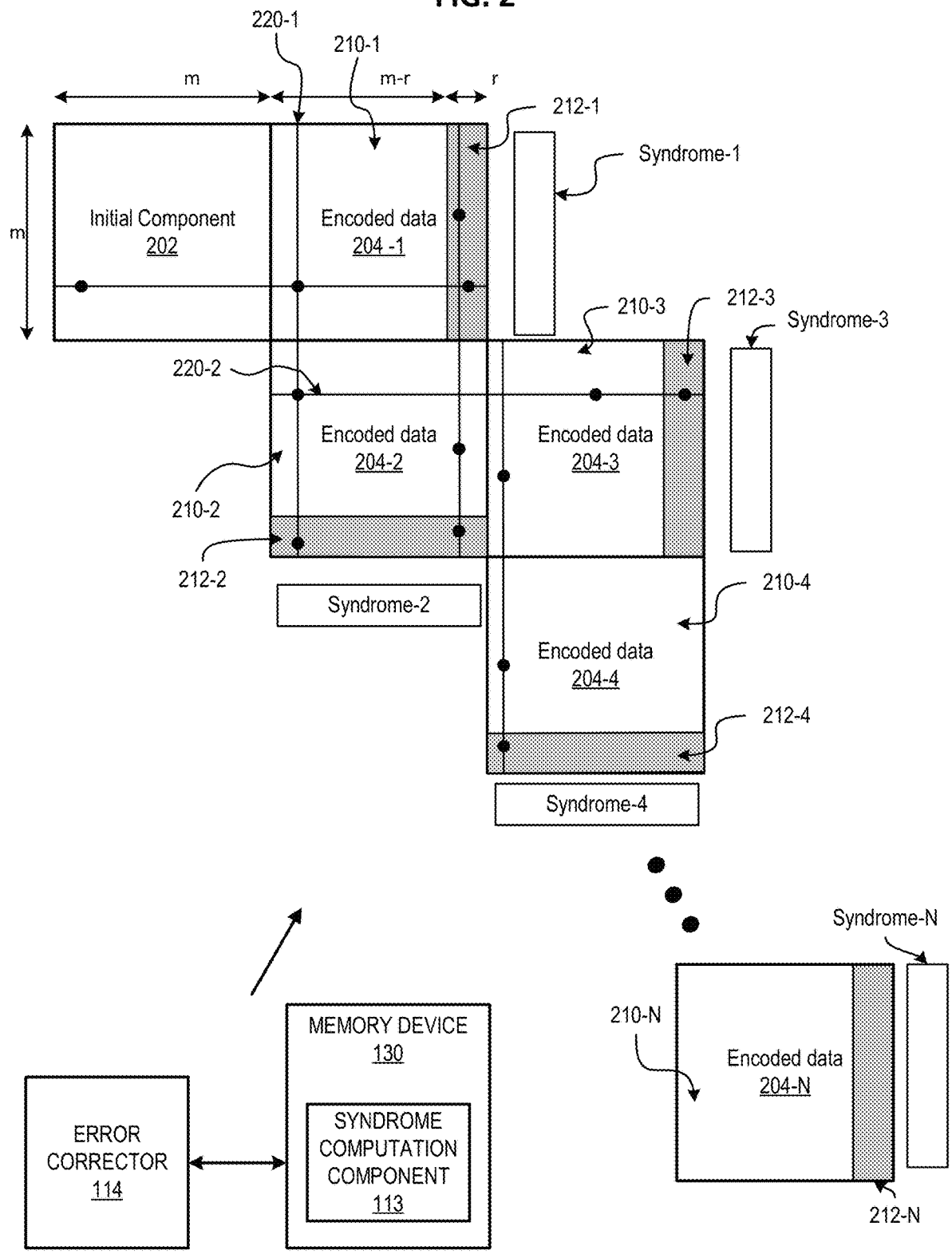
FIG. 2 is a block diagram of an example code that can be used to compute syndromes in a memory device, in accordance with some embodiments.

FIG. 2 is a block diagram of an example code 200 that can be used to compute syndromes in a memory device, in accordance with some embodiments. The code 200 can be generated, for example, by the error corrector 114 and stored in the memory device 130 or 140. The code 200 is a product code and, in the illustrated example, specifically a staircase code. The code 200 generally includes an initial component, block 202 and a number of components of encoded data 204(1)-(N). The initial component 202 can include an array of bits where each bit is set to a predetermined value. For example, each of the bits in the initial component 202 can be set to a logical 0. Alternatively, other known values can be used. Each of the encoded data 204(1-N) includes a plurality of data bits 210-(1-N) and parity bits 212-(1-N). The data bits 210 and parity bits 212, as well as the bits of the initial component 202 can be arranged in horizontal and vertical codewords of the code 200.

In the illustrated example, each of the encoded data 204(1-N) and the initial component is a block of m×m bits. A block, e.g., encoded data 204-1, includes m×(m−r) data bits 210-1 and m×r parity bits 212-1. The data bits 210-1 and the parity bits 212-1 of the encoded data 204-1 can be combined with data bits and parity bits of another block of encoded data (e.g., encoded data 204-2) to form multiple codewords, according to a particular coding scheme, such as a BCH code. The code 200 includes multiple codewords, e.g., vertical codeword 220-1 and horizontal codeword 220-2. A codeword includes multiple data bits and multiple parity bits. The codeword can be a horizontal or a vertical codeword that spans two code blocks. For example, codeword 220-1 spans block 204-1 and block 204-2, and codeword 220-2 spans blocks 204-2 and 204-3. The data bits of the codeword can include a single column of bits or a single row of bits. Alternatively or additionally, the data bits can be wrapped across multiple rows and columns of the blocks. While FIG. 2 shows parity bits at the end of each row for convenience, those skilled in the art will appreciate that the parity bits can be positioned at any point in the codeword. In various embodiments, the particular size of the blocks, as well as the number of blocks in the staircase code can be adjusted based on performance requirements. For example, embodiments with strict timing requirements can be implemented with a smaller number of blocks than embodiments with more relaxed timing requirements. By reducing the number of blocks, the decoding time can be reduced. In various embodiments, the particular pattern of the code 200 can be different from the one illustrated in FIG. 2. Multiple product code patterns, in which two or more components of the code are interrelated can be used. In some embodiments, two components of a code can share parity bits. In some embodiments, two components of a code can have a codeword that spans the two components.

FIG. 2 includes syndromes calculated for the encoded data. The syndrome computation component 113 generates one or more syndromes, syndrome-1, . . . , syndrome-N for encoded data of the code 200. In one embodiment, upon receipt of a request for data from the host system 120, the memory device 130 transmits encoded data, e.g., encoded data 204-4, to the error corrector 114. The memory device 130 further transmits a syndrome for the encoded data, syndrome-4. The memory device 130 can transmit one or more additional syndromes to the error corrector 114. For example, the memory device 130 can transmit one or multiple ones of syndrome-3, syndrome-2, and syndrome-1. The memory device 130 transmits the additional syndromes without transmitting their associated encoded data. For example, when transmitting syndrome-3, the memory device 130 does not transmit encoded data 204-3, when transmitting syndrome-2 it does not transmit encoded data 204-2, and when transmitting syndrome-1 it does not transmit encoded data 204-1. The error corrector 114 receives the encoded data 204-4 and syndrome-4 and attempts to decode the encoded data 204-4 based on this syndrome. In some embodiments, the decoding of the encoded data 204-4 based on syndrome-4 is successful when there are no errors in 204-3. Decoding the encoded data 204-4 can include detecting errors in the data bits and correcting the errors of the data bits based on the syndrome. In some embodiments, the error corrector 114 can fail to decode the encoded data 204-4 based on syndrome-4 and an additional syndrome is needed for decoding the encoded data. When the decoding of the encoded data 204-4 based on syndrome-4 fails, the error corrector 114 iteratively attempts to decode the encoded data 204-4 based on a different set of syndromes at each iteration. The iterative decoding of the encoded data 204-4 stops when the decoding is successful or no additional syndromes are available. For example, the error corrector 114 can decode the encoded data 204-4 based on syndrome-4 only. Upon determining that the decoding has failed, the error corrector 114 decodes the encoded data 204-4 based on syndrome-4 and syndrome-3 (backward direction) or based on syndrome-4 and syndrome-5 (forward direction). The process of decoding the data using multiple syndromes is described in additional detail below with reference to FIG. 3. If the decoding is successful, i.e., the data bits are corrected, the error corrector stops the decoding and the corrected data bits are sent to the host system in response to the request. When the decoding fails, the error corrector 114 continues to decode the encoded data 204-4 based on syndrome-4, syndrome-3, and syndrome-2. If the decoding is successful, i.e., the data bits are corrected, the error corrector 114 stops the decoding and the corrected data bits are sent to the host system in response to the request. When the decoding fails, the error corrector 114 continues to decode the encoded data 204-4 based on syndrome-4, syndrome-3, syndrome-2, and syndrome-1. This iterative process can be repeated until all the syndromes of the code 200 have been used in the decoding (e.g., syndrome-1, syndrome-N) or until the decoding of the encoded data succeeds. In some embodiments, the memory device 130 can transmit the additional syndromes when the decoding of the encoded data based on previously transmitted syndromes fails. In other embodiments, the memory device 130 can transmit all the syndromes of code 200 with the encoded data that is requested. For example, when encoded data 204-4 is sent to the controller, syndrome-1 to syndrome-N are transmitted with the encoded data 204-4, without transmitting additional encoded data, such as 204-1, 204-2, 204-3, 204-5, . . . , 204-N.

Although the embodiments herein are described with reference to code 200, other codes can be used. Thus, the illustrated code should be understood as an exemplary code and other codes that are decodable based on syndromes can be used in the described error corrector 114 and/or syndrome computation component 113.

Figure 3:
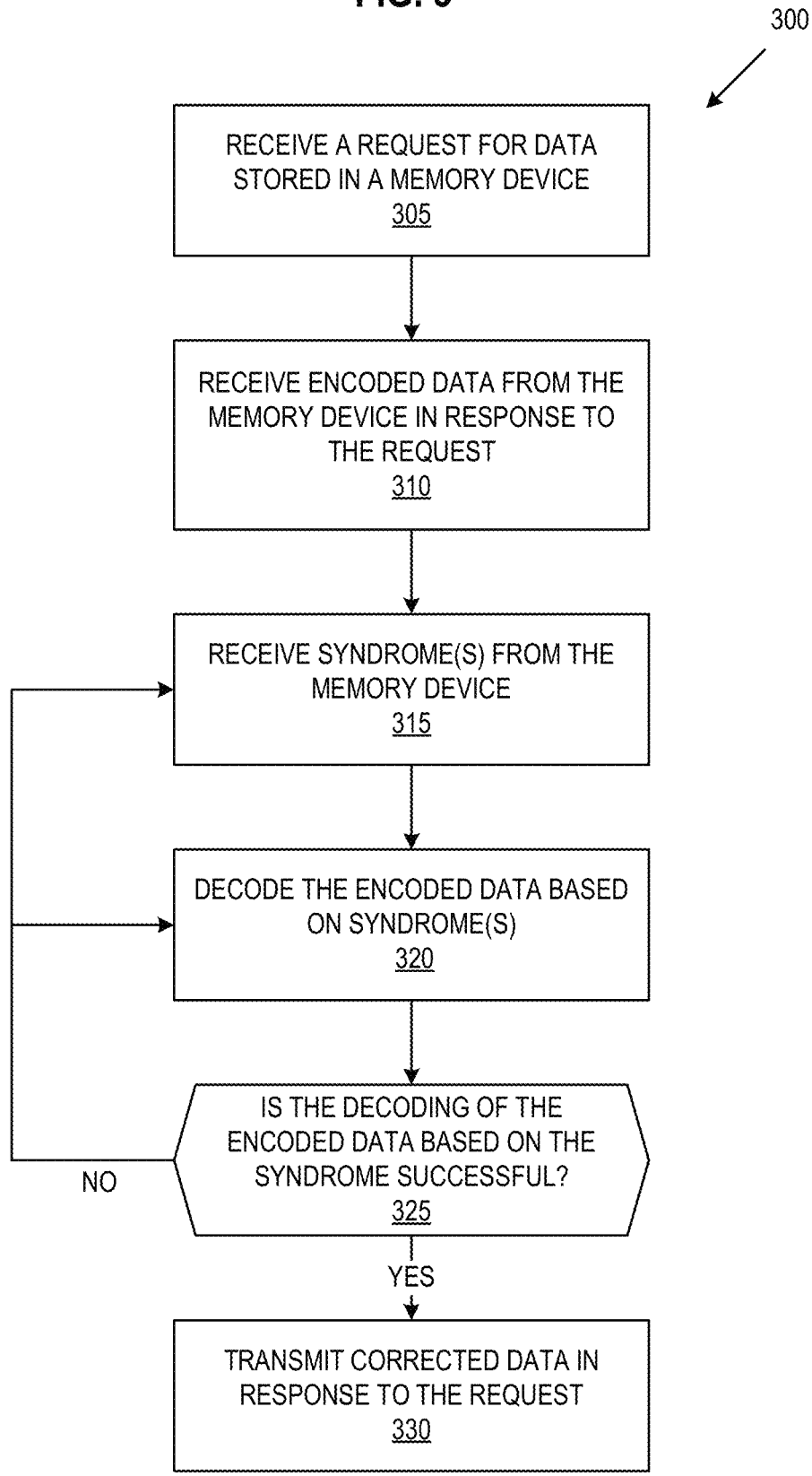
FIG. 3 is a flow diagram of an example method to correct data according to one or more syndromes received from a memory device, in accordance with some embodiments of the present disclosure.

FIG. 3 is a flow diagram of an example method 300 to correct data according to one or more syndromes received from a memory device, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the error corrector 114 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 305, the processing device receives a request for data stored in a memory device, e.g., memory device 130 or memory device 140. In some embodiments, the request is a read operation from a host system 120. In some embodiments, the request is for a block of data (e.g., data bits of block 204-4).

At operation 310, the processing device receives encoded data, e.g., block 204-4, from the memory device in response to the request. At operation 315, the processing device receives a syndrome, e.g., syndrome-4. In some embodiments, the processing device can receive the encoded data 204-4 and two or more syndromes, e.g., syndrome-4 and one or more syndromes for encoded data of code 200, e.g., syndrome-1, syndrome-2, syndrome-3, etc., or syndrome-5, syndrome-6, syndrome-7, etc. In some embodiments, the processing device receives the additional syndromes, e.g., syndrome-3, without receiving their associated encoded data, e.g., encoded data 204-3. In some embodiments, an additional syndrome can be received when the decoding of the encoded data based on previously received syndrome(s) failed. For example, the processing device can receive the encoded data 204-4 and syndrome-4 and later request and receive syndrome-3 when the decoding of the encoded data 204-4 based on syndrome-4 fails. Alternatively, the processing device can receive the encoded data 204-4, syndrome-4, and the additional syndromes regardless of whether the decoding of the encoded data 204-4 based on syndrome-4 fails.

At operation 320, the processing device decodes the encoded data based on the syndrome(s) for the encoded data. For example, the processing device can decode the encoded data 204-4 based on syndrome-4. In some embodiments, the processing device can decode the encoded data 204-4 based on syndrome-4 and based on one or more additional syndromes, e.g., syndrome-1, syndrome-2, or syndrome-3, etc. In some embodiments, the processing device decodes the encoded data 204-4 in multiple iterations, where each iteration is performed based on a combination of syndrome and different additional syndromes. For example, the processing device can decode the encoded data 204-4 based on syndrome-4, and determines, at operation 325, whether the decoding based on this syndrome is successful. Upon determining that the decoding is successful the flow of operations moves to operation 330. Alternatively, upon determining that the decoding is not successful the flow of operations moves to operation 315 or operation 320.

In some embodiments, upon determining that the decoding is not successful, the flow of operations moves to operation 315, at which the processing device receives an additional syndrome. For example, upon determining that the decoding of encoded data 204-4 based on syndrome-4 fails, the processing device receives syndrome-3. In some embodiments, prior to receiving the additional syndrome, the processing device can transmit to the memory device 130 a request for the additional syndrome. The processing device repeats the decoding operation 320 based on syndrome-3. The processing device can decode the encoded data 204-4 based on syndrome-3 and syndrome-4. For example, the processing device can use syndrome-3 to detect errors in encoded data 204-3. The processing device adjusts syndrome-4 based on the detection. The processing device detects errors and corrects errors of encoded data 204-4 based on the adjusted syndrome-4. The flow then moves to operation 325.

In other embodiments, upon determining that the decoding is not successful (i.e., the decoding fails), the flow of operations moves to operation 320, at which the processing device repeats the decoding operation 325 based on syndrome-3 as described above. In these embodiments, operation 315 is skipped as the processing device can have already received syndrome-3. The processing device can repeat the decoding of the encoded data 204-4 based on additional syndromes until all syndromes have been used or the decoding succeeds. For example, the processing device can use syndrome-1 to detect errors (i.e., error locations) in encoded data 204-1. The processing device adjusts syndrome-2 based on the detection of errors in encoded data 204-1. The processing device detects and corrects errors of encoded data 204-2 based on the adjusted syndrome-2. The processing device adjusts syndrome-3 based on the detection of errors in encoded data 204-2. The processing device detects errors of encoded data 204-3 based on the adjusted syndrome-3 and adjusts syndrome-4 based on the detection of errors in encoded data 204-3. The processing device uses adjusted syndrome-4 to detect errors and corrects errors of encoded data 204-4. In some embodiments, the processing device can use additional syndromes from forward direction (e.g., syndrome-5 (not illustrated), . . . , syndrome-N etc.) to detect errors and correct encoded data 204-4 in a similar fashion. The operations 320-325 can be repeated until the decoding of the encoded data succeeds or all available syndromes are used for decoding the encoded data. Upon determining that the decoding succeeds or no more syndromes are available, the flow moves to operation 330.

At operation 330, the processing device transmits the corrected data (or an indication of failure if the processing device was unable to decode the encoded). For example, the processing device can transmit the corrected data to the host system 120 in response to the received request.

Figure 4:
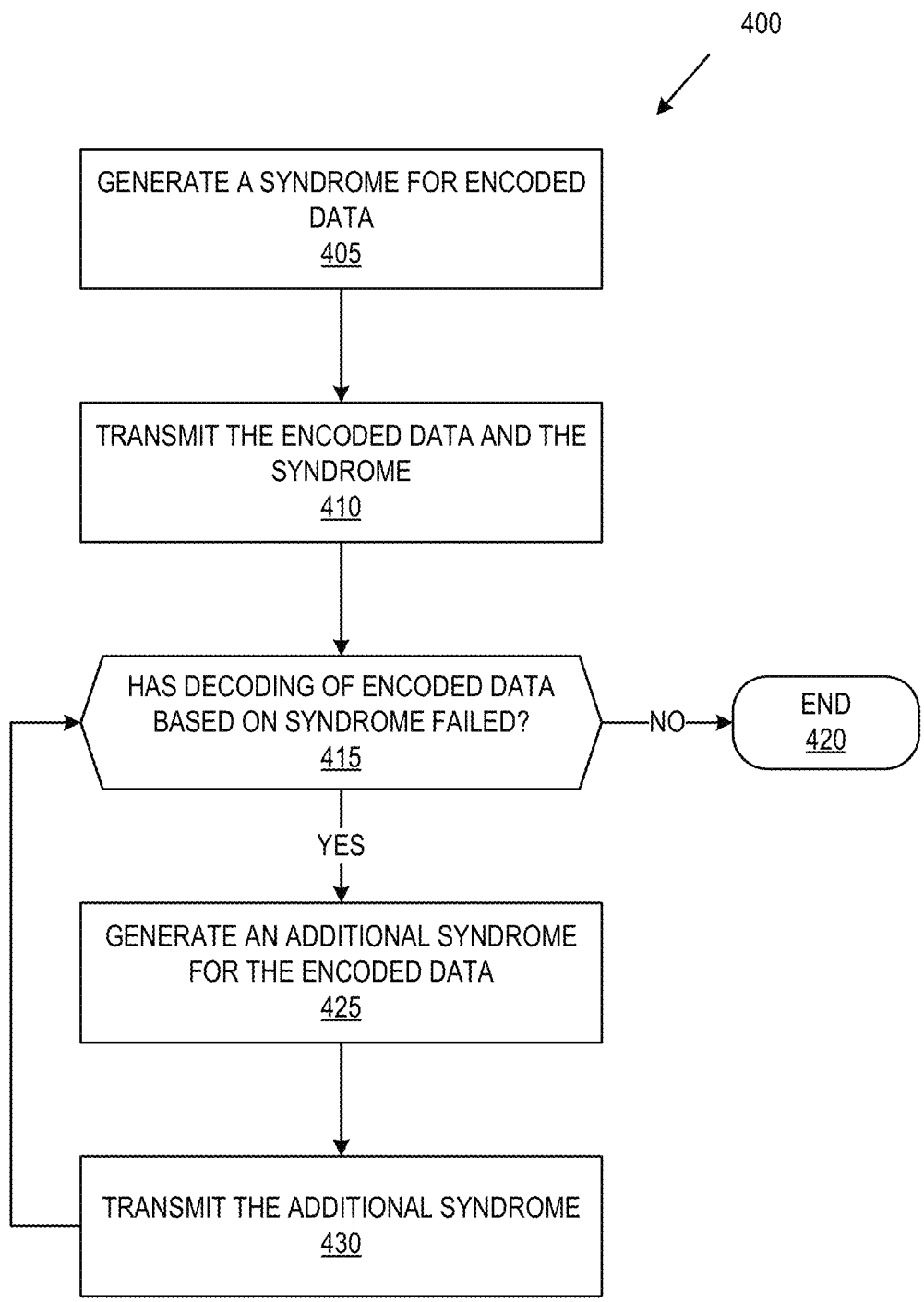
FIG. 4 is a flow diagram of an example method performed in a memory device for transmitting encoded data and syndromes in response to a request for data, in accordance with some embodiments of the present disclosure.

FIG. 4 is a flow diagram of an example method 400 performed in a memory device for transmitting encoded data and syndromes in response to a request for data, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the syndrome calculation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405 the processing device generates, in the memory device 130 or 140, a syndrome for encoded data. For example, the processing device generates syndrome-4 in response to a request for encoded data 204-4. The encoded data is a component from multiple encoded data that form a code, e.g., code 200. The encoded data includes data bits, e.g., 210-4, and parity bits, 212-4. The generation of the syndrome is based on the data bits 210-4 and on the parity bits 212-4. The generation of the syndrome depends on the underlying ECC used to encode the data. In some embodiments, the processing device generates a syndrome by performing one or more XOR operations of data bits from the data bits 210-4 and the parity bits 212-4. In some embodiments, e.g., for code 200, the processing device generates a syndrome by performing XOR operations of data bits from the data bits 210-4, the parity bits 212-4, and data bits of another block, e.g., data bits 210-3, as the two blocks, 204-3 and 204-4 share parity bits in the vertical direction. The data bits used in the XOR operation are determined by the ECC used for encoding the data as code 200.

At operation 410, the processing device transmits the encoded data and syndrome to the error corrector 114. For example, the processing device transmits the encoded data 204-4 and syndrome-4 while omitting other encoded data of the code 200. Upon receipt of the syndrome and encoded data, the error corrector 114 attempts to decode the encoded data 204-4 based on syndrome-4. In some embodiments, the error corrector 114 decodes the encoded data 204-4 as described above with reference to FIG. 3.

At operation 415, the processing device determines if the decoding of encoded data 204-4 has failed. For example, the processing device can determine that the decoding of the encoded data 204-4 has failed by receiving an indication of failure. In some embodiments, the processing device determines that the decoding of the encoded data 204-4 has failed by receiving a request for one or more additional syndromes for the encoded data 204-4. In some embodiments, when the decoding is successful, no indication or request is received and no additional operations are performed (the flow moves to operation 420). Alternatively, in response to determining that the decoding of the encoded data 204-4 has failed, the flow of operations moves to operation 425.

At operation 425, the processing device generates a syndrome by performing one or more XOR operations of data bits from the data bits 210-3 and the parity bits 212-3. In some embodiments, e.g., for code 200, the processing device generates a syndrome by performing XOR operations of data bits from the data bits 210-3, the parity bits 212-3, and data bits of an associated block, e.g., data bits 210-2, as the two blocks, 204-3 and 204-2 share parity bits in the horizontal direction. The data bits used in the XOR operation are determined by the ECC used for encoding the data as code 200.

At operation 430, the processing device transmits the additional syndrome-3 to the error corrector 114. Upon receipt of the syndrome, the error corrector 114 attempts to decode the encoded data 204-4 based on syndrome-3. In some embodiments, the error corrector 114 decodes the encoded data 204-4 as described above with reference to FIG. 3.

In some embodiments, the processing device can repeat the operations 415-430 until the encoded data is successfully decoded or all syndromes of the code 200 are generated and transmitted. In some embodiments, the processing device does not perform operation 415, and the processing device generates multiple syndromes, e.g., syndromes-(1-4) and/or syndromes-(1-N), for the encoded data 204-4, and transmit these syndromes regardless of whether the decoding of the encoded data based on some of these syndromes succeeds or not.

Figure 5:
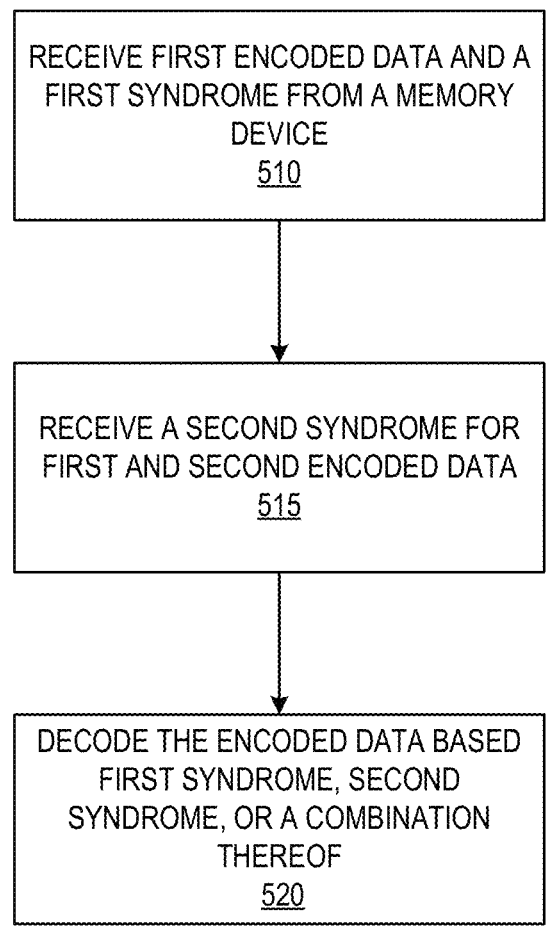
FIG. 5 is a flow diagram of another example method to correct data according to one or more syndromes received from a memory device, in accordance with some embodiments of the present disclosure.

FIG. 5 is a flow diagram of another example method to correct data according to one or more syndromes received from a memory device, in accordance with some embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the error corrector 114 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 510, the processing device receives encoded data, e.g., encoded data 204-4 and a syndrome, e.g., syndrome-4, for the encoded data from a memory device, e.g., 130 or 140. In some embodiments, the processing device receives the encoded data and a syndrome in response to a request for data stored in the memory device, e.g., memory device 130 or memory device 140. In some embodiments, the request is a read operation from a host system, e.g., host system 120. In some embodiments, the request is for a block of data (e.g., data bits of block 204-4).

At operation 515, the processing device receives, from the memory device, an additional syndrome for the encoded data. In some embodiments, the additional syndrome, e.g., syndrome-3 is for the encoded data 204-4 and other encoded data 204-3 from the multiple encoded data. The encoded data 204-4 and the other encoded data 204-3 have shared parity data, e.g., parity data 212-4. In some embodiments, the encoded data 204-4 and the other encoded data, e.g., encoded data 204-1, do not share parity bits, but are interrelated according to an error correcting code, such as exemplary code 200. The processing device receives the additional syndrome without the other encoded data. In some embodiments, the processing device receives one or more additional syndromes, e.g., syndrome-1, syndrome-2, syndrome-3, etc., as described above.

At operation 520, the processing device decodes the encoded data based on the syndrome, the additional syndrome(s), or a combination thereof. For example, the processing device can decode the encoded data 204-4 based on syndrome-4. In some embodiments, the processing device can decode the encoded data 204-4 based on syndrome-4 and based on one or more additional syndromes, e.g., syndrome-1, syndrome-2, or syndrome-3, etc. as described above.

Figure 6:
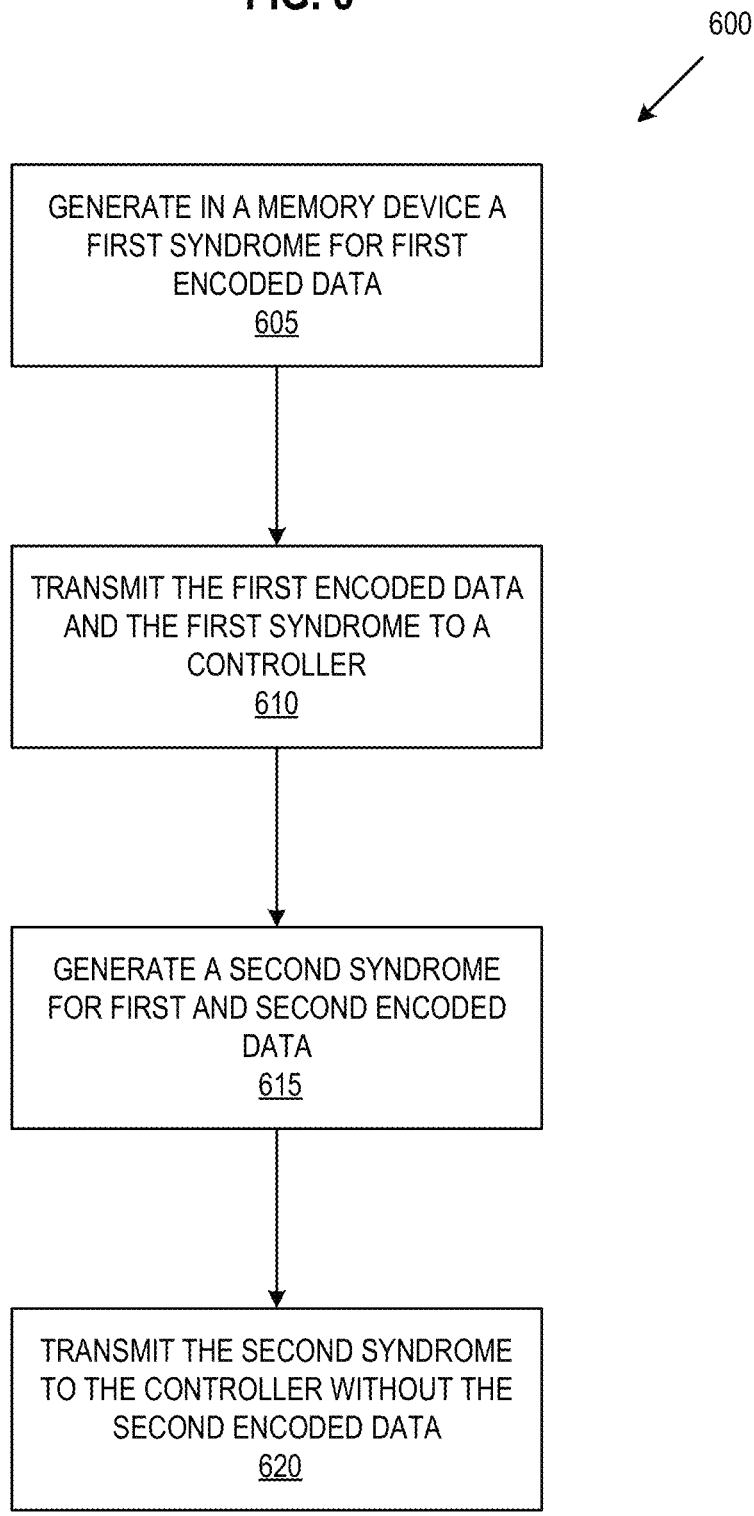
FIG. 6 is a flow diagram of another example method performed in a memory device for transmitting encoded data and syndromes in response to a request for data, in accordance with some embodiments of the present disclosure.

FIG. 6 is a flow diagram of another example method 600 performed in a memory device for transmitting encoded data and syndromes in response to a request for data, in accordance with some embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the syndrome calculation component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 605, the processing device generates, in a memory device that stores multiple encoded data such as code 200, a syndrome, e.g., syndrome-4, for encoded data, e.g., encoded data 204-4, from the multiple encoded data. The generation of the syndrome can be performed as described above.

At operation 610, the processing device transmits the encoded data and the syndrome to a controller, e.g., memory subsystem controller 115 or a controller of the host system 120, that is coupled with the memory device.

At operation 615, the processing device generates, in the memory device, an additional syndrome for the encoded data. In some embodiments, the additional syndrome, e.g., syndrome-3 is for the encoded data 204-4 and other encoded data 204-3 from the multiple encoded data. The encoded data 204-4 and the other encoded data 204-3 have shared parity data, e.g., parity data 212-4. In some embodiments, the encoded data 204-4 and the other encoded data, e.g., encoded data 204-1, do not share parity bits, but are interrelated according to an error correcting code, such as exemplary code 200. As an example, encoded data 204-2 is interrelated to encoded data 204-4 though syndrome-3 which depends on 204-2 and 204-3. In addition, syndrome-4 is a function of encoded data 204-3 and encoded data 204-4.

At operation 620, the processing device transmits the additional syndrome to the controller without the other encoded data. In some embodiments, the additional syndrome is transmitted in response to determining that the decoding of the encoded data based on the previous syndrome has failed. In other embodiments, the additional syndrome is transmitted regardless of whether the decoding of the decoded data has failed or not.

Figure 7:
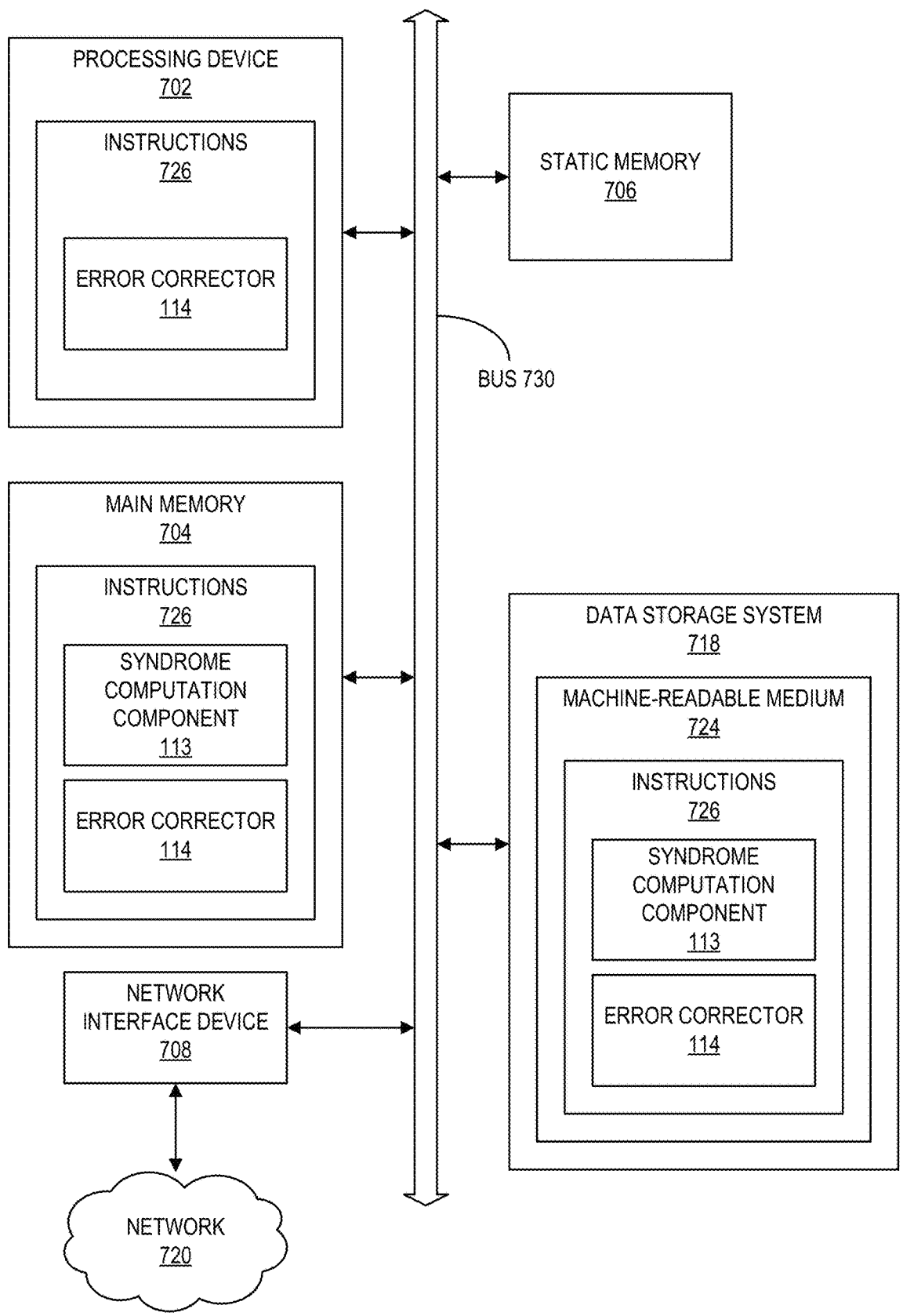
FIG. 7 is a block diagram of an example computer system in which embodiments of the present disclosure may operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the error corrector 114 and/or operations corresponding to the syndrome computation component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory subsystem 110 of FIG. 1.

In one embodiment, the instructions 726 include instructions to implement functionality corresponding to an error corrector and/or a syndrome computation component (e.g., the syndrome computation component 113 and/or the error corrector 114 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, may carry out the computer-implemented methods 300 or 500 in response to its processor executing a computer program (e.g., a sequence of instructions) contained in a memory or other non-transitory machine-readable storage medium. A computer system or other data processing system, such as the local media controller 135, may carry out the computer-implemented methods 400 or 600 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving, from a memory device that stores a plurality of encoded data, a first encoded data of the plurality of encoded data and a first syndrome for the first encoded data;
   receiving, from the memory device, a second syndrome for the first encoded data and a second encoded data from the plurality of encoded data, wherein the first encoded data and the second encoded data are interrelated according to an error correction code and wherein the second syndrome is received without the second encoded data; and
   decoding the first encoded data using at least one of the first syndrome, the second syndrome, or a combination thereof.

2. The method of claim 1, further comprising:
   requesting the second syndrome in response to a failure to decode the first encoded data based on the first syndrome.

3. The method of claim 1, wherein the error correction code is a staircase code.

4. The method of claim 1, wherein the first encoded data includes first data bits and first parity bits stored in the memory device, and the first syndrome is generated based on the first data bits and the first parity bits.

5. The method of claim 4, wherein the first syndrome is further based on second data bits of the second encoded data.

6. The method of claim 4, wherein the first encoded data and the first and second syndromes are received in response to a host request for the first data bits.

7. The method of claim 1, wherein the first encoded data and the second encoded data share parity bits.

8. A non-transitory computer-readable storage medium comprising instructions that, when executed by a processing device, cause the processing device to:
   receive, from a memory device that stores a plurality of encoded data, a first encoded data of the plurality of encoded data and a first syndrome for the first encoded data;
   receive, from the memory device, a second syndrome for the first encoded data and a second encoded data from the plurality of encoded data, wherein the first encoded data and the second encoded data are interrelated according to an error correction code and wherein the second syndrome is received without the second encoded data; and
   decode the first encoded data using at least one of the first syndrome, the second syndrome, or a combination thereof.

9. The non-transitory computer-readable storage medium of claim 8, wherein the processing device is further to:

request the second syndrome in response to a failure to decode the first encoded data based on the first syndrome.

10. The non-transitory computer-readable storage medium of claim 8, wherein the error correction code is a staircase code.

11. The non-transitory computer-readable storage medium of claim 8, wherein the first encoded data includes first data bits and first parity bits stored in the memory device, and the first syndrome is generated based on the first data bits and the first parity bits.

12. The non-transitory computer-readable storage medium of claim 11, wherein the first syndrome is further based on second data bits of the second encoded data.

13. The non-transitory computer-readable storage medium of claim 11, wherein the first encoded data and the first and second syndromes are received in response to a host request for the first data bits.

14. The non-transitory computer-readable storage medium of claim 8, wherein the first encoded data and the second encoded data share parity bits.

15. A system comprising:
a memory device; and
a processing device, operatively coupled with the memory device, to:
receive, from the memory device that stores a plurality of encoded data, a first encoded data of the plurality of encoded data and a first syndrome for the first encoded data;
request, from the memory device, a second syndrome for the first encoded data and a second encoded data from the plurality of encoded data in response to a failure to decode the first encoded data based on the first syndrome;
receive, from the memory device, the second syndrome, wherein the first encoded data and the second encoded data are interrelated according to an error correction code and wherein the second syndrome is received without the second encoded data; and
decode the first encoded data using at least one of the first syndrome, the second syndrome, or a combination thereof.

16. The system of claim 15, wherein the error correction code is a staircase code.

17. The system of claim 15, wherein the first encoded data includes first data bits and first parity bits stored in the memory device, and the first syndrome is generated based on the first data bits and the first parity bits.

18. The system of claim 17, wherein the first syndrome is further based on second data bits of the second encoded data.

19. The system of claim 17, wherein the first encoded data and the first and second syndromes are received in response to a host request for the first data bits.

20. The system of claim 15, wherein the first encoded data and the second encoded data share parity bits.

* * * * *